United States Patent [19]

Musslyn et al.

[11] Patent Number: 4,687,970
[45] Date of Patent: Aug. 18, 1987

[54] DIGITAL CATHODE CURRENT CONTROL LOOP

[75] Inventors: Eugene F. Musslyn, Carson; Anand Kelkar, Anaheim, both of Calif.

[73] Assignee: Hughes Aircraft Company, Los Angeles, Calif.

[21] Appl. No.: 740,109

[22] Filed: May 31, 1985

[51] Int. Cl.[4] ..................... H05B 39/04; H05B 41/36
[52] U.S. Cl. ..................................... 315/106; 315/35; 330/43; 331/82; 328/172
[58] Field of Search ................. 330/43; 315/3.5, 106, 315/107; 331/82; 328/172, 254

[56] References Cited

U.S. PATENT DOCUMENTS

| | | | |
|---|---|---|---|
| 3,165,696 | 1/1965 | Poole | 330/43 |
| 3,825,839 | 7/1974 | Someya et al. | 315/106 |
| 3,872,351 | 3/1975 | Smith et al. | 315/107 |
| 4,000,471 | 12/1976 | Pankow | 330/43 |
| 4,398,132 | 8/1983 | Razin et al. | 315/106 |
| 4,471,265 | 9/1984 | Rasmusson | 315/3.5 |
| 4,525,652 | 6/1985 | Sperzel et al. | 315/106 |

Primary Examiner—Saxfield Chatmon
Attorney, Agent, or Firm—Thomas A. Runk; Anthony W. Karambelas

[57] ABSTRACT

A digital cathode current control circuit for controlling the cathode current of a traveling wave tube (TWT) amplifier is disclosed. The cathode current control circuit includes circuitry for providing a comparison signal indicative of the occurrence and amplitude of TWT cathode current pulses; clocking circuitry responsive to the comparison signal for providing a clock signal delayed relative the occurrence of a cathode current pulse; comparison circuitry for comparing the comparison signal with predetermined reference signals indicative of a predetermined cathode current level, and for providing adjustment signals indicative of the adjustment of the TWT cathode current necessary to tend to achieve the predetermined cathode current; and counter circuitry clocked by the delayed clock signal for providing an output count in response to the adjustment signals.

15 Claims, 2 Drawing Figures

DIGITAL CATHODE CURRENT CONTROL LOOP

The United States Government has rights to this invention pursuant to Contract No. DAAK20-81-C-0390 awarded by the Department of the Army.

BACKGROUND OF THE INVENTION

The present invention relates to cathode current control circuits for traveling wave tube (TWT) amplifiers, and is more particularly directed to a cathode current control circuit for providing closed-loop control to maintain the cathode current of a gridded TWT amplifier at a predetermined level.

TWT devices are typically designed for operation at optimum cathode current levels. Operation at optimum cathode current levels generally provides for increased operating lifetimes, while deviation from such optimum cathode current levels reduces operating lifetimes.

Practical financial and technical considerations limit the extent to which uniformity can be realized with respect to characteristics of electron gun assemblies, thereby resulting in the necessity of both initial and intra-life operating parameter adjustments. Throughout the useful life of a TWT, or other filamented devices, dimensional changes occur within the electron gun assembly, and reduction in the emissive properties of the base cathode material similarly occur. These changes tend to change the TWT cathode current and the output of a TWT amplifier.

As a result of the foregoing characteristics of TWT devices, adjustment of TWT operating parameters must be made upon initial installation and during the operating lifetime. Typically, such adjustments are made by human operators and are directed to changing the available grid-pulse voltage to obtain the required TWT cathode current. Adjustment by a human operator may require a certain level of skill and specialized test equipment, and provides potential for error.

The cathode current in a TWT is normally controlled in pulsed operations by the grid pulse voltage. Typical controllers used for controlling TWT cathode current are believed to require tens of milliseconds to achieve a stable TWT beam current, and require periodic refreshing (TWT beam pulsing) to retain the beam current reference and the required beam current stability. Such known controller circuits are believed to be analog in nature and used in applications where response and decay times are of lesser concern.

SUMMARY OF THE INVENTION

It would therefore be an advantage to provide a cathode current control circuit which provides for closed loop control without human operator intervention of the cathode current of a traveling wave tube (TWT), a gridded microwave device, or a gridded power amplifier tube.

It would also be an advantage to provide a digital cathode current control circuit for closed loop control of the cathode current in a TWT amplifier which does not require periodic refreshing for proper operation.

Another advantage would be to provide a cathode current control circuit which avoids periodic adjustments made by a human operator during the operating lifetime of a TWT.

Still another advantage would be to provide a cathode current control circuit which minimizes the necessity for initial human operator adjustment.

A further advantage would be to provide a cathode current control circuit for maintaining the cathode current of a TWT at an optimum level to provide an increased operating lifetime.

The foregoing advantages and features are provided by the invention in a cathode current control circuit which includes circuitry for providing a comparison signal indicative of the occurrence and amplitude of TWT cathode current pulses; clocking circuitry responsive to the comparison signal for providing a clock signal delayed relative to the occurrence of a cathode current pulse; comparison circuitry for comparing the comparison signal with predetermined reference signals indicative of a predetermined cathode current level, and for providing adjustment signals indicative of the adjustment of the TWT cathode current necessary to tend to achieve the predetermined cathode current; and counter circuitry clocked by the delayed clock signal for providing an output count in response to the adjustment signals. The adjustment signals cause the counter output to be substantially increased (coarse adjustment) if the cathode current is not sufficiently close to the predetermined cathode current level. If the cathode current as represented by a comparison voltage pulse indicates that the cathode current is sufficiently close to the predetermined cathode current level, the counter output is changed by a small incremental value (fine adjustment). The counter output is provided to a digital-to-analog converter which provides a control voltage for controlling a grid pulse level control amplifier.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

Figure 1:
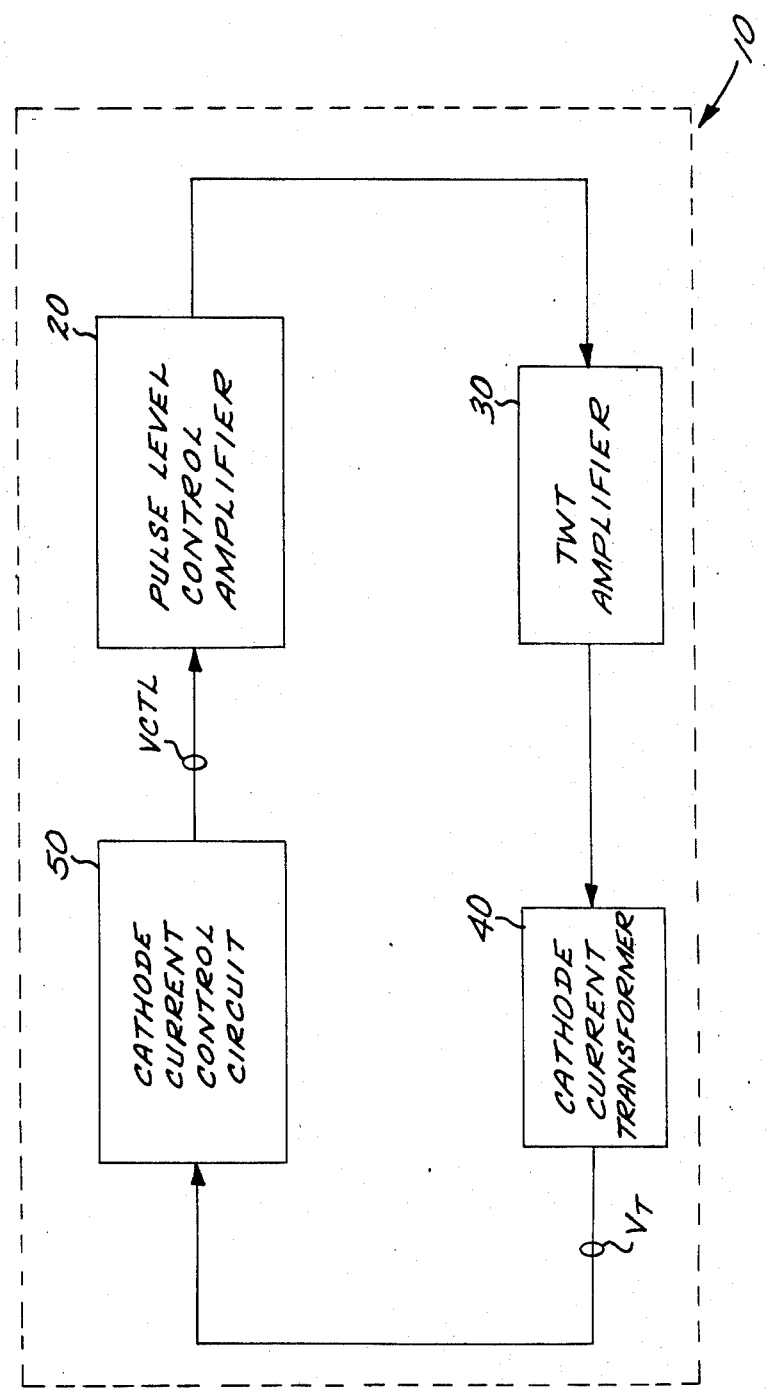
FIG. 1 is a block diagram of a cathode current control loop for a typical traveling wave tube (TWT) amplifier.

In the following detailed description and in the several figures of the drawing, like elements are identified with like reference numerals.

Referring now to FIG. 1, shown therein is a block diagram of a cathode current control loop 10 which includes a pulse level control amplifier 20 for controlling the grid voltage of a pulsed traveling wave tube (TWT) RF amplifier 30. A cathode current transformer 40 senses the TWT cathode current and provides a transformer output voltage $V_T$ indicative of the instantaneous TWT cathode current amplitude.

The cathode current control loop 10 further includes a cathode current control circuit 50 which is responsive to the transformer output voltage $V_T$ and provides a control signal VCTL to the pulse level control amplifier 20.

Figure 2:
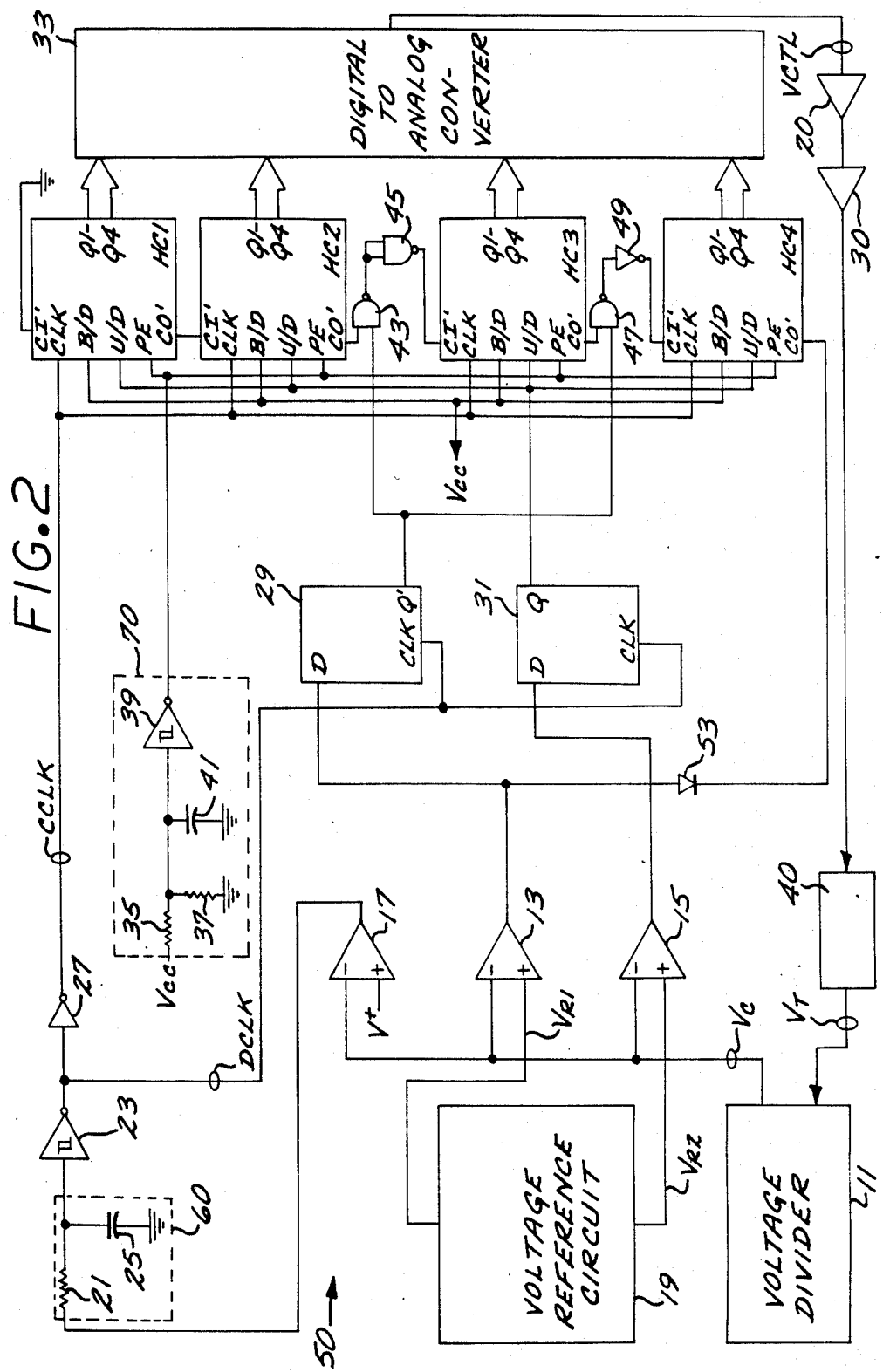
FIG. 2 is a partial schematic diagram of the cathode current control circuit of the cathode current control loop of FIG. 1.

Referring now to FIG. 2, shown therein is a partial schematic diagram of the cathode current control circuit 50 which includes a voltage divider 11 which is responsive to the transformer output voltage $V_T$ and provides a comparison voltage $V_C$ which is a function of the TWT cathode current. Thus, the amplitude of the comparison voltage $V_C$ is indicative of the level or amplitude of the TWT cathode current, and provides positive going pulses in response to cathode current pulses.

The comparison voltage $V_C$ is coupled to the inverting inputs of a plurality of voltage comparators 13, 15, 17. As more fully discussed herein, the comparator 13 provides a coarse adjust output; the comparator 15 provides a fine adjust output; and the comparator 17 functions as a threshold comparator and provides a logic compatible output for triggering a delayed clock.

The coarse adjust comparator 13 receives at its non-inverting input a first reference voltage $V_{R1}$ from a voltage reference circuit 19. Thus, the coarse adjust comparator 13 provides a logical low output when the comparison voltage $V_C$ is greater than or equal to the first reference voltage $V_{R1}$. Otherwise, the output of the coarse adjust comparator 13 is a logical high. In the absence of a comparison voltage $V_C$ pulse, the output of the coarse adjust comparator 13 is high.

The fine adjust comparator 15 receives at its non-inverting input a second reference voltage $V_{R2}$ from the voltage reference circuit 19. Thus, the fine adjust comparator 15 provides a logical low output when the comparison voltage $V_C$ is greater than or equal to the second reference voltage $V_{R2}$. Otherwise, the output of the fine adjust comparator 15 is a logical high. In the absence of a comparison voltage $V_C$ pulse, the output of the fine adjust comparator 15 is high.

The second reference voltage $V_{R2}$ is selected to correspond to the desired cathode current, and the first reference voltage $V_{R1}$ is slightly lower than the second reference voltage $V_{R2}$. By way of example, the voltage reference circuit 19 may be a switched resistive ladder whereby the second reference voltage $V_{R2}$ may be manually preselected; and the first reference voltage $V_{R1}$ may also be determined by such selection, or may be determined by a voltage divider circuit in conjunction with the resistive ladder.

The non-inverting input of the threshold comparator 17 is coupled to a positive threshold voltage V+ which is sufficiently above zero volts to avoid the effects of noise on the threshold comparator 17, but sufficiently low so that it is exceeded by the comparison voltage $V_C$ upon the occurrence of a cathode current pulse. Thus, the threshold comparator 17 provides a negative going pulse for every positive going pulse of the comparison voltage $V_C$.

The output of the threshold comparator 17 is coupled to one terminal of a resistor 21 which has its other terminal coupled to the input of an inverting Schmitt trigger buffer 23. A capacitor 25 is coupled between the input to the inverting buffer 23 and ground. The output of the inverting buffer 23 is coupled to the input of an inverter 27.

The inverting Schmitt trigger buffer 23 provides as its output a clock signal DCLK which includes a positive going clock transition pursuant to a negative going pulse at the output of the threshold comparator 17. As discussed more fully herein, the clock signal DCLK provides the clock inputs to D-type flip-flops.

The inverter 27 provides as its output a clock signal CCLK which includes a positive going clock transition delayed by a predetermined interval relative to the negative going transition of the output of the threshold comparator 17. Specifically, sufficient delay is provided so that the positive transition of the CCLK clock signal occurs after the cathode current pulse has ceased. Such delay is substantially provided by the resistor 21 and the capacitor 25 which comprise an RC network 60. As discussed more fully herein, the clock signal CCLK provides the clock inputs to a plurality of counters.

The output of the coarse adjust comparator 13 is coupled to the data input of a D-type flip-flop 29. The flip-flop 29 is responsive to a positive going clock transition, and receives at its clock input the DCLK clock signal provided by the output of the inverting Schmitt trigger buffer 23.

The output of the fine adjust comparator 15 is coupled to the data input of a D-type flip-flop 31. The flip-flop 31 is responsive to a positive going clock transition, and receives at its clock input the DCLK clock signal provided by the output of the inverting Schmitt trigger buffer 23.

The cathode current control circuit 50 further includes a plurality of interconnected hexadecimal (i.e., four-bit) up/down counters HC1, HC2, HC3, HC4, each of which may be a commercially available integrated circuit such as the Type CD4029, which is described in an RCA data book, "COS/MOS Integrated Circuits," pp. 122–127, 1978. For reference purposes, each of the hexadecimal counters HC1, HC2, HC3, HC4 includes a clock input CLK, a carry input CI', a binary/decade input B/D, an up/down input U/D, a preset enable input PE, and four preset inputs A, B, C, D (not shown). Each of the hexadecimal counters HC1, HC2, HC3, HC4 provides a carry output CO', and the count outputs Q1, Q2, Q3, Q4.

The general operation of an individual counter will be now described. A high signal at its preset enable input PE allows the signals at the preset inputs A, B, C, D to preset the counter asynchronously of the clock. A positive going clock transition at its clock input CLK advances the counter one count if the signals at the carry input CI' and the preset enable input PE are both low. Thus, the carry input CI' can be considered a clock enable input which when low allows counter advancement pursuant to a clock signal. The carry output CO' is normally high and goes low when the counter reaches its maximum count in the UP mode or when it reaches its minimum count in the DOWN mode.

The count mode of a counter is binary if the signal at its binary/decade input B/D is high. If the signal at its B/D input is low, it counts in the decade mode. The counter direction of count is UP when the signal at its up/down input U/D is high, and is DOWN when the signal at its U/D input is low.

From the foregoing it should be readily evident that parallel clocking and control of a plurality of the above-described counters which have carry outputs CO' coupled to successive carry inputs CI' provide a 4N-bit counter, where N is the number of hexadecimal counters interconnected.

The outputs of the hexadecimal counters HC1, HC2, HC3, HC4 represent a sixteen bit binary number wherein the outputs of the counter HC1 provide the least significant bits (LSB's) and the outputs of the counter HC4 represent the most significant bits (MSB's). The sixteen bit binary output of the hexadecimal counters HC1, HC2, HC3, HC4 are provided to a digital-to-analog (D/A) converter 33 which provides a control voltage VCTL to the pulse level control amplifier 20. The control voltage VCTL is a function of the value of the sixteen-bit binary output of the hexadecimal counters HC1, HC2, HC3, HC4. Different types of D/A converters are well known in the art and, by way of example, a resistive ladder type D/A converter may be utilized as the D/A converter 33.

Each of the hexadecimal counters HC1, HC2, HC3, HC4 has its preset data inputs A, B, C, D coupled to ground so that their outputs are set to all zeroes upon the occurrence of a high preset enable signal at its preset enable input PE which is coupled to a preset circuit 70. The preset circuit 70 includes serially connected resistors 35, 37 coupled between a source of positive voltage $V_{CC}$ and ground. The input of an inverting Schmitt trigger buffer 39 is coupled to the node between the resistors 35, 37 and also to one terminal of a capacitor 41 which has its other terminal coupled to ground. Upon power-up, the preset circuit 70 provides a positive going pulse which causes outputs Q1, Q2, Q3, Q4 of the counters HC1, HC2, HC3, HC4 to be preset to zeroes.

The binary/decade inputs B/D of the hexadecimal counters HC1, HC2, HC3, HC4 are coupled to the source of positive voltage $V_{CC}$, so that the count mode is always binary.

The up/down inputs U/D of the counters HC1, HC2, HC3, HC4 are coupled to the Q output of the D flip-flop 31. As discussed previously, the count direction is UP when the signal at the U/D input is high, and the count direction is DOWN when the signal at the U/D input is low.

The carry output CO' of the counter HC1 is provided to the carry input CI' of the counter HC2. The carry output CO' of the counter HC2 is coupled to an input of a two input NAND gate 43 which also receives an input from the negated output Q' of the D flip-flop 29. The output of the NAND gate 43 is coupled to both inputs of a two input NAND gate 45, which therefore functions as an inverter. The output of the NAND gate 45 is coupled to the carry input CI' of the counter HC3, which has its carry output CO' coupled to an input of a two input NAND gate 47. The other input of the NAND gate 47 is also provided by the negated output Q' of the D flip-flop 29. The output of the NAND gate 47 is inverted by an inverter 49 which has its output coupled to the carry input CI' of the counter HC4.

The carry output CO' of the counter HC4 is coupled to the cathode of a diode 53 which has its anode coupled to the output of the coarse adjust voltage comparator 13. As discussed further herein, the diode 53 functions to pull the output of the coarse adjust comparator to low when the carry output CO' of the counter HC4 is low which indicates that the counter HC4 is at its maximum count.

In operation, the threshold comparator 17 provides a negative going output pulse upon the occurrence of a positive going pulse of the comparison voltage $V_C$. Pursuant to such negative going output pulse of the threshold comparator 17, the clock signal DCLK provides a positive going clock transition and the clock signal CCLK provides a delayed positive going clock transition. Thus, pursuant to a cathode pulse, the D type flip-flops 29, 31 are first clocked by DCLK and the hexadecimal counters HC1, HC2, HC3, HC4 are subsequently clocked by CCLK.

The operation of the hexadecimal counters HC1, HC2, HC3, HC4 pursuant to a positive clock transition of the clock signal CCLK depends on the output states of the flip-flops 29, 31 which in turn depend on the outputs of the coarse adjust and fine adjust comparators 13, 15.

If the amplitude of a pulse of the comparison voltage $V_C$ is less than the first voltage reference $V_{R1}$ and the carry output CO' of the counter HC4 is high, then the output of the coarse adjust comparator 13 remains high and the Q' output of the flip-flop 29 latches low. The output of the fine adjust comparator also remains high and the Q output of the flip-flop 31 latches high. Thus, the counters HC1, HC2, HC3, HC4 are enabled to count up, and the carry inputs CI' of the counters HC3, HC4 are low. As a result, on the positive transition of the clock signal CCLK, the count output of the hexadecimal counters HC1, HC2, HC3, HC4 increases dramatically. Particularly, each of the counters HC3, HC4 increments by one; and though of less significance on the sixteen bit binary output of the hexadecimal counters HC1, HC2, HC3, HC4, the eight bit output of the counters HC1, HC2 is incremented by one. Effectively, the sixteen bit binary output of the hexadecimal counters HC1, HC2, HC3, HC4 is increased by $1101_{16}$.

If the carry output CO' of the counter HC4 is low, then the negated output Q' of the flip-flop 29 is held high. This prevents any further coarse adjustment since the highest order counter HC4 is at its maximum count of $1111_2$ or $F_{16}$. However, fine adjustments will take place pursuant to the output of the fine adjust comparator 15.

If the amplitude of a pulse of the comparison voltage $V_C$ is equal to or greater than the first reference voltage $V_{R1}$, the output of coarse adjust comparator goes low and the Q' output of the flip-flop 29 latches high. The NAND gates 43, 47 therefore function as inverters; and effectively the logical state at the carry output CO' of the counter HC2 is provided at the carry input CI' of the counter HC3, and the logical state at the carry output CO' of the counter HC3 is provided at the carry input CI' of the counter HC4. Therefore, the sixteen bit count output of the hexadecimal counters HC1, HC2, HC3, HC4 is either increased or decreased by one. Such count is increased by one if the pulse of the comparison voltage $V_C$ is less than the second reference voltage $V_C$, or is decreased by one if the pulse of the comparison voltage $V_C$ is greater than or equal to the second reference voltage $V_C$.

An example based upon the initial pulsing of a TWT amplifier may be helpful. The desired cathode current is initially chosen by setting the voltage reference circuit 19 to provide the appropriate second reference voltage $V_{R2}$ which corresponds to the desired cathode current. Upon power-up of the cathode control circuit 50, the sixteen bit output of the counters HC1, HC2, HC3, HC4 is preset to $0000_{16}$. The first cathode current pulse will be below the desired cathode current pulse level, and therefore a coarse adjustment and a fine adjustment takes place pursuant to positive transitions of the clock signals DCLK and CCLK. The sixteen bit output of the hexadecimal counters HC1, HC2, HC3, HC4 pursuant to the first cathode current pulse will therefore be $1101_{16}$.

If the second cathode current pulse is below the cathode current level represented by the first reference voltage $V_{R1}$ another coarse adjustment and fine adjustment will occur, and the sixteen bit output of the hexadecimal counters HC1, HC2, HC3, HC4 will be increased by $1101_{16}$ to provide an output of $2202_{16}$.

Each subsequent cathode current pulse which is below the cathode current level represented by the first reference voltage $V_{R1}$ will result in a coarse adjustment and a fine adjustment so long as the carry output CO' of the counter HC4 is high, indicating that it is not at maximum count. Each coarse adjustment and fine adjustment increases the sixteen bit output of the hexadecimal counters HC1, HC2, HC3, HC4 by $1101_{16}$.

When the cathode current pulse is greater than or equal to the cathode current level represented by the first reference voltage $V_{R1}$ or when the counter HC4 has reached its maximum count, coarse adjustment will cease but fine adjustment will continue pursuant to the output of the fine adjust comparator 15.

Although the foregoing discussion has been directed to a sixteen-bit counter implementation, other counter implementations may be readily utilized, depending on the dynamic range required for a particular application. For example, if a greater dynamic range is contemplated, a twenty-bit counter implementation may be appropriate.

The foregoing has been a description of a digital cathode current control circuit which efficiently controls the cathode current of a TWT amplifier with minimal operator intervention upon installation and without operator intervention for the operating life of the TWT. Further, the disclosed cathode current control circuit does not require periodic cathode current pulsing for proper operation.

Although the foregoing has been a description and illustration of specific embodiments of the invention, various modifications and changes thereto can be made by persons skilled in the art without departing from the scope and spirit of the invention as defined by the following claims.

What is claimed is:

1. A cathode current control circuit for use with a pulsed traveling wave tube (TWT) having a cathode current, comprising:
   means for providing a comparison signal indicative of the occurrence and amplitude of a TWT cathode current pulse;
   comparing means for comparing said comparison signal with at least two predetermined reference signals indicative of a predetermined cathode current level, said comparing means for providing adjustment signals indicative of the adjustment of the TWT cathode current necesary to tend to achieve said predetermined cathode current;
   clocking means responsive to said comparison signal for providing a clock signal delayed relative to the occurrence of a cathode current pulse; and
   control means responsive to said adjustment signals and to said delayed clock signal for providing a control signal indicative of an adjusted TWT cathode current level.

2. The cathode current control circuit of claim 1 wherein said comparing means comprises:
   coarse adjustment comparison means responsive to said comparison signal for providing a coarse adjustment signal indicative of whether a large adjustment of the cathode current level is required; and
   fine adjustment comparison means responsive to said comparison signal for providing a fine adjustment signal indicative of whether a fine adjustment of the cathode current level is required.

3. The cathode current control circuit of claim 2 wherein said coarse adjustment comparison means includes a comparator responsive to said comparison signal and a first reference signal, and wherein said fine adjustment comparison means includes a comparator responsive to said comparison signal and a second reference signal.

4. The cathode current control circuit of claim 3 wherein said comparison signal comprises a comparison voltage, and wherein said first and second reference signals comprise first and second reference voltages.

5. The cathode current control circuit of claim 2 wherein said control means comprises counter circuitry which is clocked by said delayed clock signal.

6. The cathode current control circuit of claim 5 wherein said counter circuitry provides a substantially increased count in response to said coarse adjustment signal.

7. The cathode current control circuit of claim 6 wherein said counter circuitry includes a plurality of counters.

8. The cathode current control circuit of claim 1 wherein said clocking means includes a voltage comparator for providing a comparator output pursuant to the occurrence of a cathode current pulse, and a delay circuit responsive to said comparator output for providing a clock signal delayed relative to said comparator output.

9. A cathode current control circuit comprising:
   means for providing comparison signal pulses indicative of the occurrence and amplitude of cathode current pulses;
   first comparison means responsive to said comparison signal pulses for selectively providing a coarse adjust signal when a comparison signal pulse is less than a first reference signal;
   second comparison means responsive to said comparison signal pulses for providing a fine adjust signal indicative of whether a comparison signal pulse is less than a second reference signal which is greater than said first reference signal;
   clocking means responsive to said comparison signal pulses for providing clock pulses delayed relative to said comparison signal pulses; and
   counting means clocked by said delayed clock pulses and responsive to said coarse adjust signal and said fine adjust signal for providing a counter output indicative of an adjusted cathode current level.

10. The cathode current control circuit of claim 9 wherein said counting means provides a substantially increased counter output in response to said coarse adjust signal.

11. The cathode current control circuit of claim 10 wherein said fine adjust signal causes said counter output to increase when said comparison signal pulse is less than said second reference signal, or to decrease when said comparison signal pulse is greater than said second reference signal.

12. The cathode current control circuit of claim 11 wherein said counting means includes a plurality of binary counters.

13. A cathode current control circuit for use with a pulsed gridded device having a cathode current, comprising:
   means for providing first and second reference voltages indicative of a predetermined cathode current level, said first reference voltage being less than said second reference voltage;
   sensing means responsive to the cathode current for providing comparison voltage pulses representative of cathode current pulses;
   a first voltage comparator responsive to said comparison voltage pulses and said first reference voltage for selectively providing a coarse adjust signal when a comparison voltage pulse is less than said first reference voltage;

second comparison means responsive to said comparison voltage pulses and said second reference voltage for providing a fine adjust signal indicative of whether said comparison voltage pulse is less than said second reference voltage;

clocking means responsive to said comparison voltage pulses for providing clock pulses delayed relative to said comparison voltage pulses; and a counter circuit clocked by said delayed clock pulses and responsive to said coarse adjust signal and said fine adjust signal for providing a counter output indicative of an adjusted cathode current level, said counter circuit providing a substantially increased counter output in response of said coarse adjust signal and further providing a small incremental change in said counter output in response to the presence or absence of said fine adjust signal; and a digital to analog converter responsive to said counter output for providing an analog control voltage which is utilized to control the cathode current level.

14. A cathode current control circuit for use with a pulsed traveling wave tube (TWT) having a cathode current, comprising:

means for providing a comparison signal indicative of the occurrence and amplitude of a TWT cathode current pulse;

comparing means for comparing said comparison signal with at least two predetermined reference signals indicative of a predetermined cathode current level, said comparing means for providing adjustment signals indicative of the adjustment of the TWT cathode current necessary to tend to achieve said predetermined cathode current;

clocking means responsive to said comparison signal for providing a clock pulse which occurs after termination of a selected cathode current pulse; and control means supplied with said clock pulse and responsive to said adjustment signals for generating a control signal indicative of an adjusted TWT cathode current level after receipt of said clock pulse.

15. The cathode current control circuit of claim 1 wherein said comparing means comprises:

coarse adjustment comparison means responsive to said comparison signal and a first of said at least two predetermined reference signals for providing a coarse adjustment signal indicative of whether a large adjustment of the cathode current level is required; and fine adjustment comparison means responsive to said comparison signal and a second of said at least two predetermined reference signals for providing a fine adjustment signal indicative of whether a fine adjustment of the cathode current level is required.

* * * * *